United States Patent
Chen

(10) Patent No.: US 6,694,289 B1
(45) Date of Patent: *Feb. 17, 2004

(54) FAST SIMULATION METHOD FOR SINGLE AND COUPLED LOSSY LINES WITH FREQUENCY-DEPENDENT PARAMETERS BASED ON TRIANGLE IMPULSE RESPONSES

(75) Inventor: Zhaoqing Chen, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/345,923

(22) Filed: Jul. 1, 1999

(51) Int. Cl.[7] ............................................... G06F 17/50
(52) U.S. Cl. ............................. 703/14; 703/13; 703/15
(58) Field of Search ............................ 703/13, 14, 15; 395/765, 500; 716/4

(56) References Cited

U.S. PATENT DOCUMENTS

| | | | | |
|---|---|---|---|---|
| 5,025,402 A | * | 6/1991 | Winkelstein ................. | 703/14 |
| 5,055,795 A | * | 10/1991 | Kasper et al. ................. | 330/54 |
| 5,313,398 A | * | 5/1994 | Rohrer et al. .................. | 703/14 |
| 5,371,853 A | * | 12/1994 | Kao et al. ................. | 704/200.1 |
| 5,379,231 A | * | 1/1995 | Pillage et al. ................. | 703/14 |
| 5,481,484 A | * | 1/1996 | Ogawa et al. ................. | 703/14 |
| 5,502,392 A | * | 3/1996 | Arjavalingam et al. ..... | 324/638 |
| 5,559,997 A | * | 9/1996 | Tsuchida et al. .............. | 716/1 |
| 5,717,618 A | * | 2/1998 | Menkhoff et al. .......... | 708/313 |
| 5,903,477 A | * | 5/1999 | Otsu et al. ...................... | 703/5 |
| 6,028,989 A | * | 2/2000 | Dansky et al. ................. | 716/8 |
| 6,051,027 A | * | 4/2000 | Kapur et al. .................... | 703/5 |
| 6,207,936 B1 | * | 3/2001 | de Waard et al. ............ | 219/497 |
| 6,226,330 B1 | * | 5/2001 | Mansur ........................ | 375/257 |
| 6,234,658 B1 | * | 5/2001 | Houldsworth ................ | 364/489 |
| 6,342,823 B1 | * | 1/2002 | Dansky et al. ................... | 333/1 |
| 6,353,801 B1 | * | 3/2002 | Sercu et al. .................... | 702/65 |
| 6,360,283 B1 | * | 3/2002 | Houldsworth ................... | 710/3 |
| 6,418,401 B1 | * | 7/2002 | Dansky et al. ................ | 703/27 |
| 6,445,692 B1 | * | 9/2002 | Tsatsanis ..................... | 370/342 |

OTHER PUBLICATIONS

Antonio Maffucci, Giovanni Miano, Jul. 7, 1999, IEEE, IEEE Transactions on Circuits and Systems–I: Fundamental Theory and Applications, vol. 46, NO 7, "Irregular Terms in the Impulse Response of a Multiconductor Lossy Transmission Line"; pp. 788–805.*

Sharad Kapur, David E. Long, Jaijeet Roychowdhury, 1996, IEEE, "Efficient Time–Domain Simulation of Frequency–Dependent Elements"; pp. 569–573.*

Fung–Yeul Chang, 1994, IEEE, IEEE Transactions on Components, Packaging, and Manufacturing Technology–Part B, vol. 17 No. 1 Feb. 1994, "Transient Simulation of Frequency–Dependent Nonuniform Coupled Lossy Transmission Lines"; pp. 3–14.*

Jose I. Alonso, Jose Borja, Felix Perez, 1991, IEEE MTT–S Digest,"A Universal Model for Lossy and Dispersive Transmission Lines for Time Domain CAD of Circuits"; pp. 991–994.*

(List continued on next page.)

Primary Examiner—Russell Frejd
Assistant Examiner—Dwin Craig
(74) Attorney, Agent, or Firm—Lynn L. Augspurger

(57) ABSTRACT

A fast simulation method for single and coupled lossy transmission lines is based on triangle impulse responses. The method is used in simulating systems which can consist of large number of lossy transmission lines with frequency-dependent parameters which are placed in a high-speed IC package design.

4 Claims, 6 Drawing Sheets

OTHER PUBLICATIONS

Dan Winklestein, Michael B. Steer, Real Pomerleau, IEEE Transactions on Circuits and Systems, vol. 38, No. 4 Apr. 1991, "Simulation of Arbitrary Transmission Line Networks with Nonlinear Terminations"; pp. 418–422.*

J.C. Liao, O.A. Palusinski, J.L. Prince, "Computation of Transients in Lossy VLSI Packaging Interconnections", Department of Electrical & Computer Engineering, The University of Arizona, IEEE 1990; pp. 173–179.*

Omar Wing, 1991 International Conference on Circuits and Systems, Jun. 1991, Shenzhen, China, "On VlSI Interconnects", 1991 IEEE; pp. 991–996.*

Jun-Fa Mao, Ernest S. Kuh, "Fast Simulation and Sensitivity Anaylsis of Lossy Transmission Lines by the Method of Characteristics", IEEE 1997, pp. 391–401.*

First Level Package Design Considerations for IBM's S/390 G5 Server, published in Proc. IEEE 7th Topical Meet. Elect. Performance Electron, Package, West Point, NY, Oct. 1998—pp. 15–16.

* cited by examiner

LUT=LINE UNDER TEST
LLL=LONG LINE LOAD

FAST SIMULATION METHOD FOR SINGLE AND COUPLED LOSSY LINES WITH FREQUENCY-DEPENDENT PARAMETERS BASED ON TRIANGLE IMPULSE RESPONSES

FIELD OF THE INVENTION

This invention relates to circuit simulation and particularly to a fast simulation method for single and coupled lossy lines with frequency-dependent parameters based on triangle impulse responses.

Trademarks: S/390, RS/6000 and IBM are registered trademarks of International Business Machines Corporation, Armonk, N.Y., U.S.A. Other names may be trademarks or product names of International Business Machines Corporation, as is G5, or other companies.

BACKGROUND

There are a lot of transmission lines in a package for a mainframe computer system as discussed by G. Katapis, D. Becker, and H. Stoller, in the article "First level package design considerations for IBM's S/390 G5 server," published in *Proc. IEEE 7th Topical Meet. Elect. Performance Electron. Packag.*, West Point, N.Y., Oct. 1998, pp.15–16. As system clock frequency and integration density increase, the loss of a transmission line in IC package can no longer be neglected. In mainframe computer package design and other high-speed IC package design applications, I have to simulate systems with large number (for example, 100 k) of single and coupled lossy transmission lines. In addition to accuracy, simulation time is another important criterion for a tool. The existing models for lossy transmission lines are, I have found to be, usually too slow to be used directly in such a simulation, especially when frequency-dependent properties such as skin-effect are taken into account. Fast simulation methodology becomes one of the key issues in accurate design of high-speed IC package in mainframe computers.

SUMMARY OF THE INVENTION

A fast simulation method is provided for simulating loss in transmission lines for a netlist for an IC package. Based on a triangle impulse response database of lossy transmission lines, this method has a much faster speed than, and a satisfactory accuracy as compared with, existing tools. The new method of calculating uses a triangle impulse response database generated for a test circuit. Then, my new method calculates iteratively, with the use of triangle waveforms represented as time domain basis functions for a netlist for an IC package and also requests for triangle impulse responses from the database of lossy transmission lines, the time domain response of netlist circuit transmission lines with different lengths and different dimensions for the IC package.

These and other improvements are set forth in the following detailed description. For a better understanding of the invention with advantages and features, refer to the description and to the drawings.

My detailed description explains the preferred embodiments of my invention, together with advantages and features, by way of example with reference to the drawings.

DETAILED DESCRIPTION OF THE INVENTION

Figure 1:
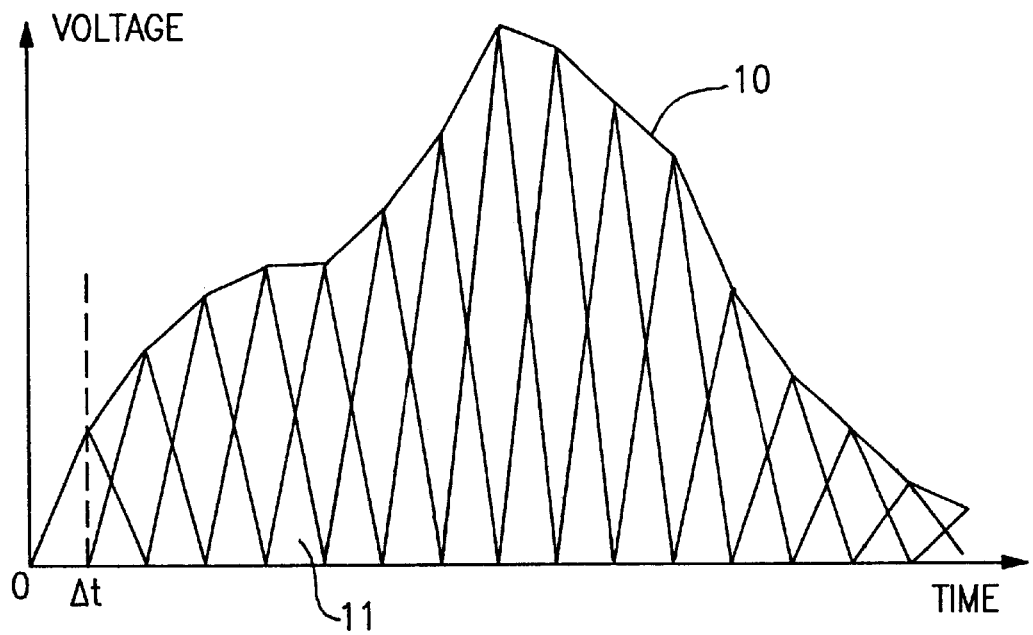
FIG. 1 illustrates a waveform composed by triangle basis waveforms.

I use triangle waveforms 11 as time domain basis functions to represent any waveforms (10 in FIG. 1) so the time domain response can be calculated by superposition of triangle impulse responses. We have illustrated in the drawings an N-coupled transmission line section (FIG. 2) and the equivalent circuit which is a result of our invention (FIG. 3). The equations for calculating $i_j(t)$ which and $w_j(t)$ (j=1, 2, . . . ,2N) in FIG. 3 are given as the following:

$$i_j(t) = \sum_{n=1}^{\infty} (w_j(t - n\Delta t) - v_j(t - n\Delta t)) \cdot i_{TIRj}((n+1)\Delta t) \quad (1)$$

$$(j = 1, 2, \ldots, 2N)$$

$$w_j(t) = \sum_{n=1}^{\infty} \sum_{\substack{m=1 \\ m \neq j}}^{2N} (2v_m(t - n\Delta t) - w_m(t - n\Delta t)) \cdot v_{TIRmj}((n+1)\Delta t) \quad (2)$$

$$(j = 1, 2, \ldots, 2N)$$

Figure 2:
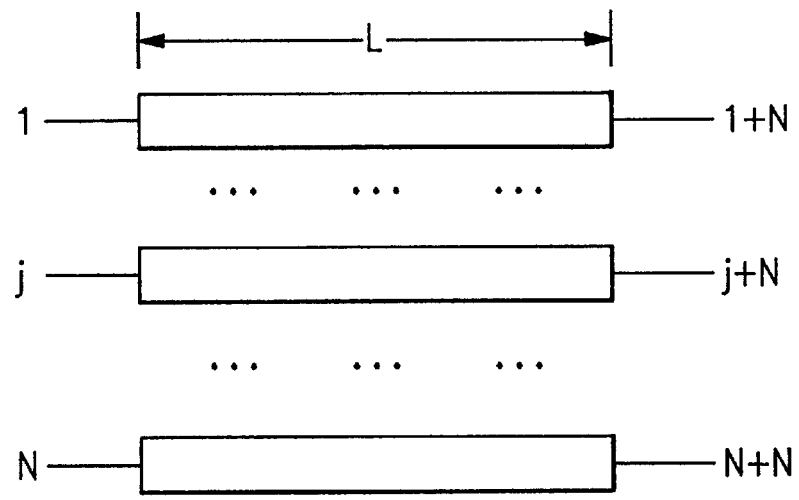
FIG. 2 illustrates a N-coupled transmission line section.
Figure 3:
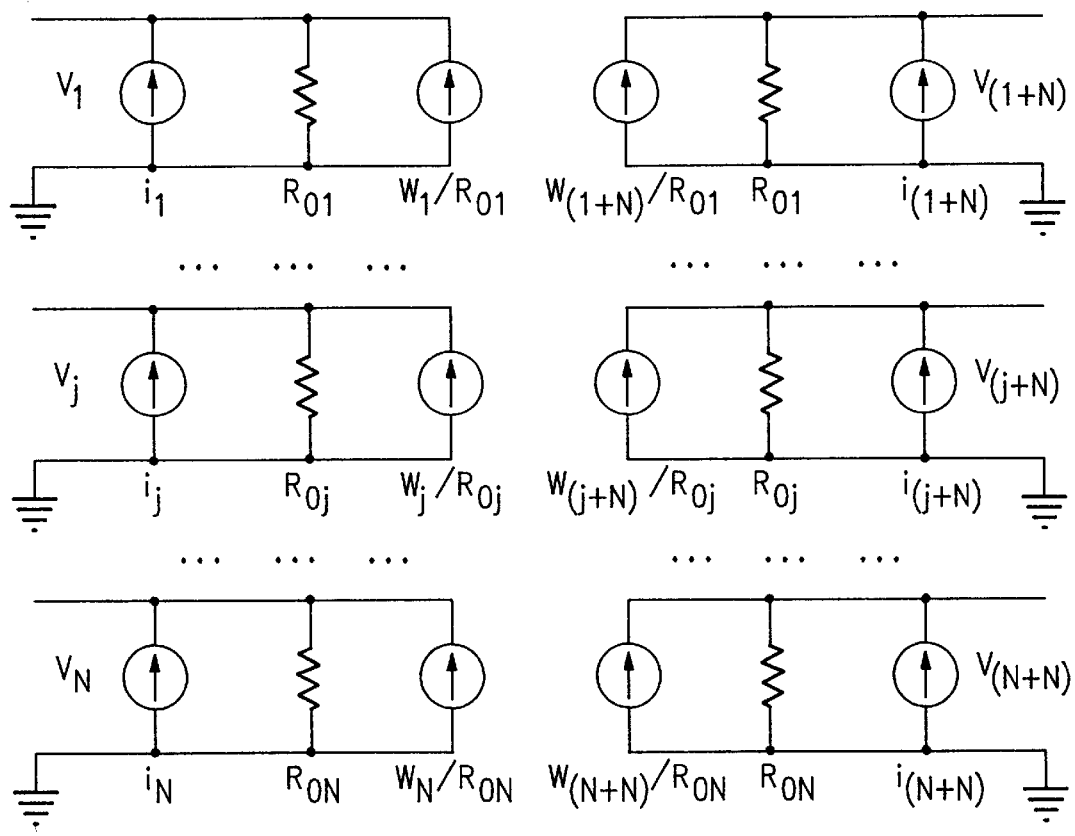
FIG. 3 illustrates the equivalent circuit of the N-coupled transmission line section of FIG. 2.

(where $i_j(t)$ is the current source representing the imaginary part of the characteristic impedance of transmission line j in FIG. 2, and $w_j$ is a current source representing the coupling and transmission for line j of FIG. 2.)

Now, with reference to these equations, the current source $i_j(t)$ is caused by the imaginary part of $Z_{oj}$ which is the characteristic impedance of transmission line j, while $R_{oj}$ is the real part of $Z_{oj}$. Also, $i_{TIRj}(t)$ and $V_{TIRmj}(t)$ are triangle impulse responses that I will discuss later in the next section, and $\Delta t$ is the simulation time step used in our method, and something that is also used by the simulation tool used to generate triangle impulse responses which are stored in a database on disk and used by our method.

A general-purpose simulation tool based upon the above equations has been developed. Lumped (concentrated at a single point, as opposed to a transmission line) elements such as resistor, inductor, capacitor, and voltage and current sources are also available with this tool which we have implemented for transmission lines. During simulation in accordance with our method of implementing the calculations described by the above equations, the whole IC package circuit is divided into many local circuits separated by transmission lines and solved individually at every simulation time step.

Figure 4:
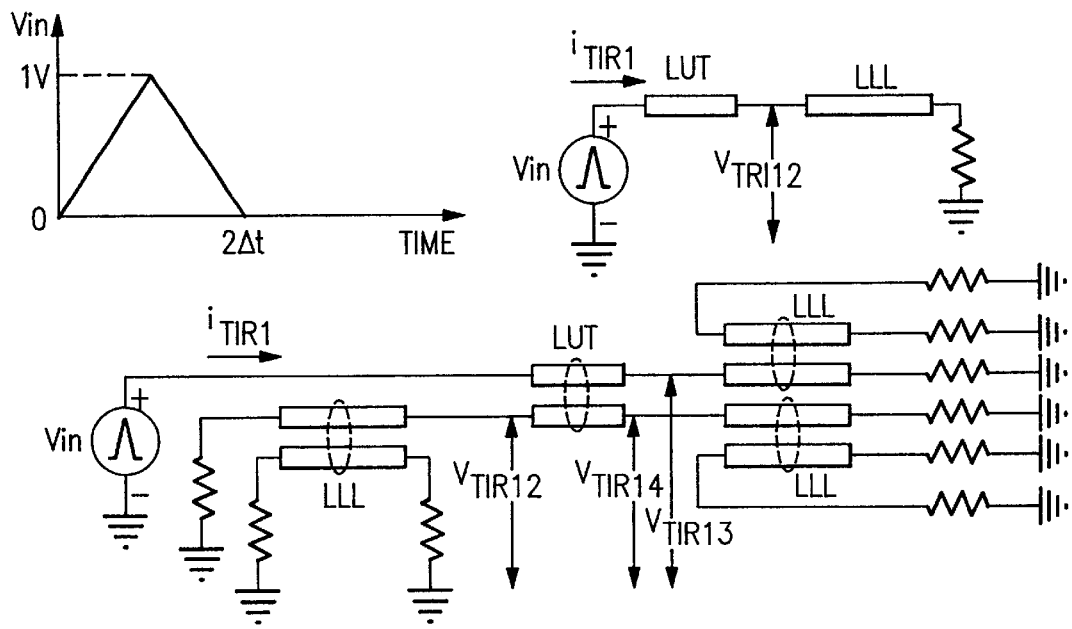
FIG. 4 illustrates ASX (an IBM simulation tool) schematics for generating triangle impulse responses of single and 2-coupled lines.
Figure 5:
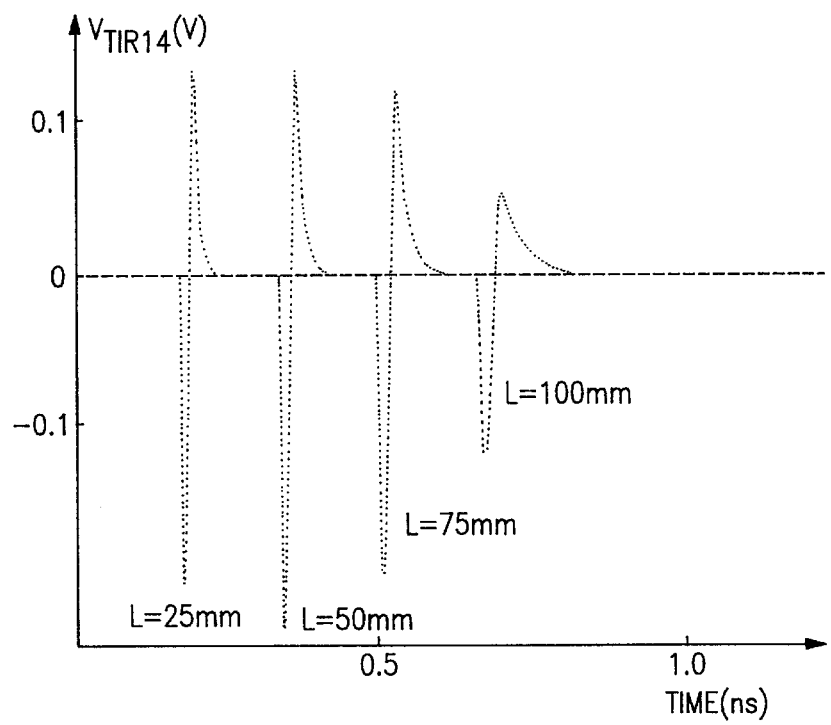
FIG. 5 shows the triangle impulse response of far end coupled noise $V_{TIR14}$.

Before running the new simulation tool, the process uses and, therefore, one needs to have or to set up a database containing triangle impulse responses for lossy transmission lines. To do this, I prefer to run ASX, an IBM simulation tool including lossy transmission line models with frequency-dependent parameters, to get triangle impulse responses of lossy transmission lines. Other tools would be acceptable. The circuit schematics for ASX simulation of a test case for generating the basic triangle impulse responses of single and 2-coupled transmission lines are shown in FIG. 4. A voltage source $V_{in}$ with a triangle waveform of unit peak value and 2 Dt width is used to obtain the triangle impulse responses. FIG. 5 shows $V_{TIR14}$, an example of one of the triangle impulse responses of a lossy 2-coupled transmission line.

Figure 6:
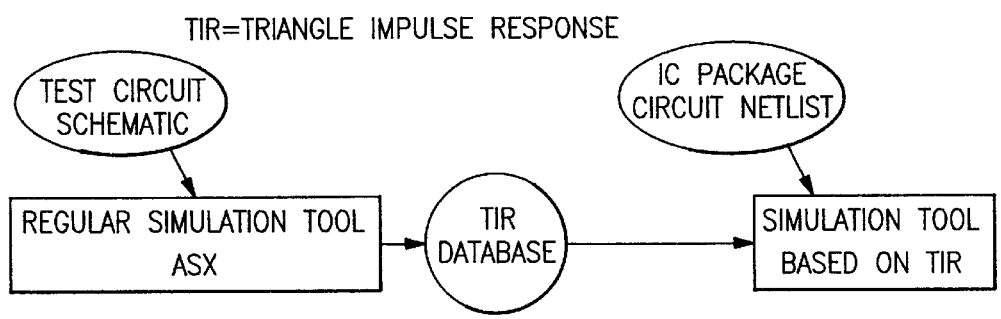
FIG. 6 shows a flow chart of the simulation method for single and coupled lossy lines with frequency-dependent parameters based on triangle impulse responses.

All triangle impulse responses are inherently line-length-dependent except $i_{TIR1}$ in single line. The basic test case circuit (FIG. 4) triangle impulse responses are put into a database (represented as the stored data of FIG. 5) for use by the our simulation tool. The flow chart of data is shown in FIG. 6. By using interpolation for every transmission line in a circuit for an IC package design just before simulation with the new tool, I need only a limited number of triangle impulse responses to be generated by ASX and stored in the database on disk, represented in FIG. 6 by the TIR database's FIG. 5's data.

Figure 7:
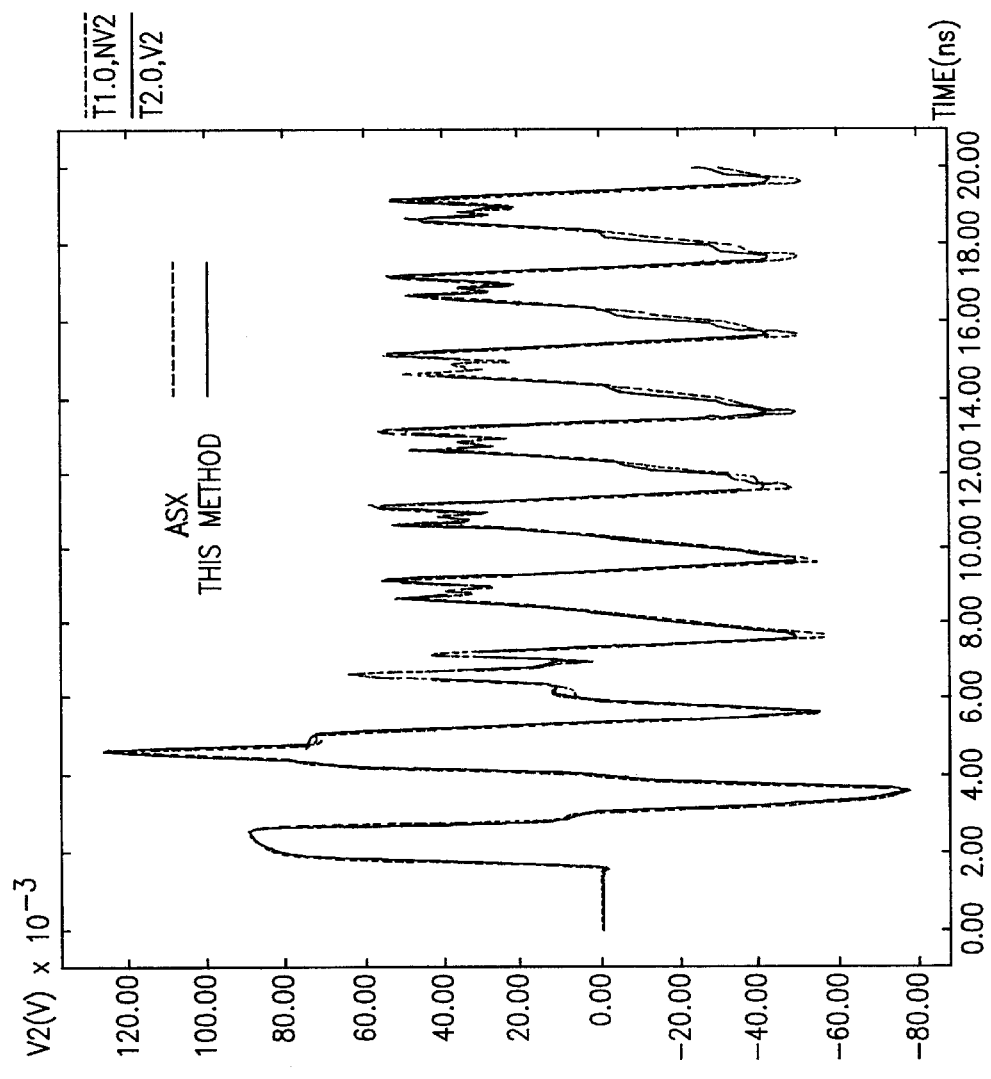
FIG. 7 represents a circuit simulated for use in verification of the method described.
Figure 8:
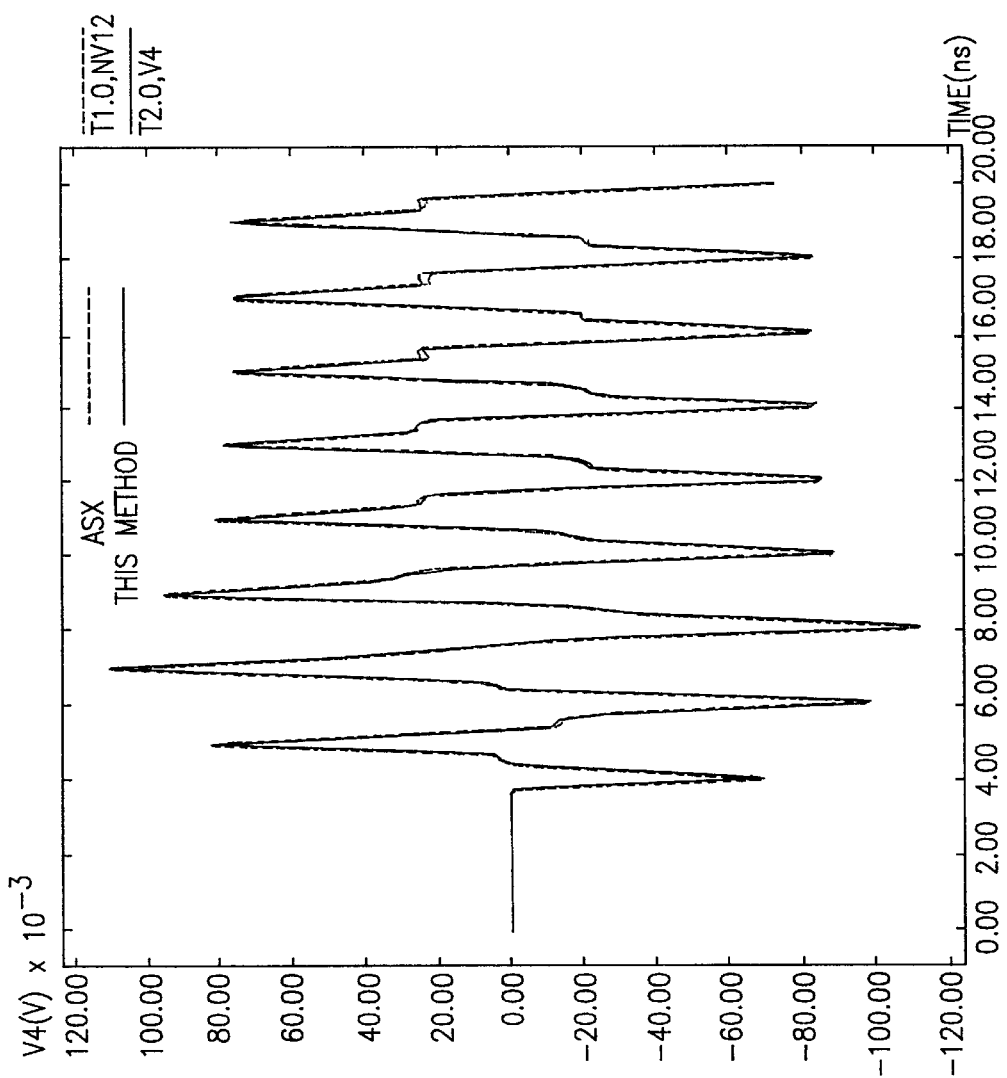
FIG. 8 shows the comparison of $V_2$ in FIG. 6 by the new method and by the ASX tool.
Figure 9:
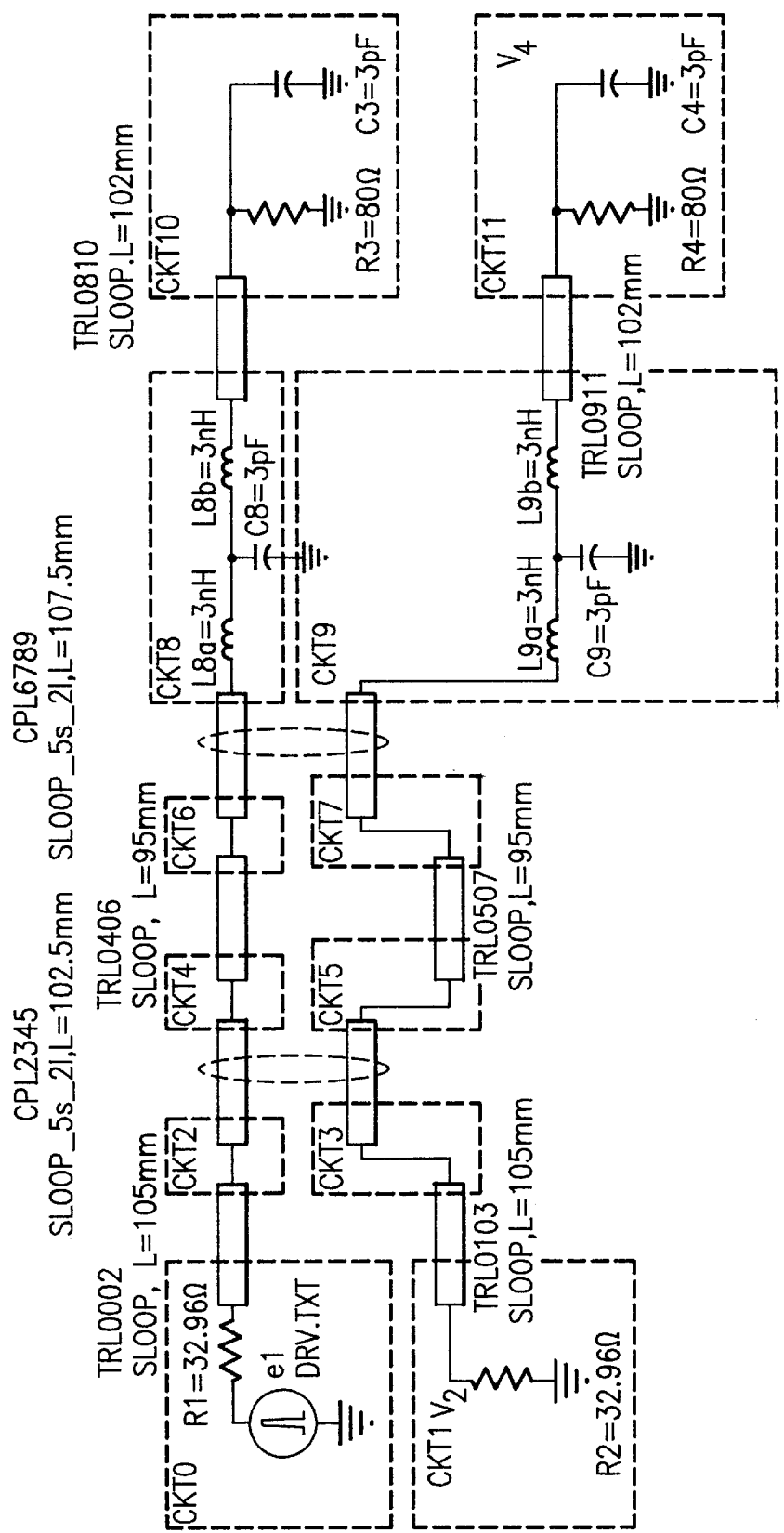
FIG. 9 shows the comparison of $V_4$ in FIG. 6 by the new method and by the ASX tool.

For comparison of our improvement shown in FIG. 6, I have replaced the original driver model and its excitation source used in ASX with a simplified model which consists of a resistor and a piece-wise linear voltage source and is derived from the original model. The results for near end and far end coupling noises are shown in FIG. 7 and FIG. 8 compared with those by ASX where the dashed line represents that obtained by ASX which, the results with our simplified model, are shown as "this method"'s solid line. As you can see, the tool using this method has almost the same accuracy as the tool used to generate the triangle impulse response database. However, the CPU time by "this method" on an IBM RS/6000 43P Model 260 Workstation only took to simulate the circuit shown in FIG. 9 2.6 seconds for the 20 ns circuit waveform length performance time (2000 time steps), and 6.6 seconds for 200 ns circuit waveform length performance time (20000 time steps), respectively. By regular simulation tool ASX, the time would be 75 seconds for a 20 ns circuit waveform performance time when the simplified driver model is also used.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for use in simulation of single and coupled lossy lines, comprising the steps of:

employing a database storing a number of triangle inpulse responses as V-t or I-t curves of lossy transmission lines created use of a test circuit schematic input to a simulation tool for generating triangle inpulse responses for said test circuit; and generating with said simulation tool the stored number of said triangle inpulse responses and storing the stored number of triangle inpulse responses in said database as V-t or I-t curves for retrieval by a database request; and during a simulation for an integrated circuit (IC) package for determining how the IC package is to be laid out on a chip providing as a input to a simulation tool a netlist for said IC package, and thereafter calculating with a circuit simulation tool iteratively with the use of triangle waveforms represented as time domain basis functions for the netlist for said IC package and requests for triangle impulse responses from said database of lossy transmission lines the time domain response of transmission lines of said IC package for said netlist in order to verify the existing design for said IC package.

2. A method according to claim 1 wherein when the triangle impulse response is calculated a termination setup is introduced for the triangle impulse response, which is excited by a triangle impulse with an amplitude of 1 and a width of 2Δt.

3. A method according to claim 1 wherein the time domain response is calculated for the time domain response of netlist circuit transmission lines with different lengths and different dimensions for the IC package.

4. A method according to claim 1 wherein in the step used for the iterative determination of the time domain response for circuits of the IC package the equations for calculating $i_j(t)$ which and $w_j(t)$ for the transmission lines (j=1, 2, . . . ,2N), using for I-t and V-t curves $i_{TIRj}$ and $V_{TIRmj}$ respectively, are:

$$i_j(t) = \sum_{n=1}^{\infty} (w_j(t-n\Delta t) - v_j(t-n\Delta t)) \cdot i_{TIRj}((n+1)\Delta t) \quad (1)$$

$$(j = 1, 2, \ldots, 2N)$$

$$w_j(t) = \sum_{n=1}^{\infty} \sum_{\substack{m=1 \\ m \neq j}}^{2N} (2v_m(t-n\Delta t) - w_m(t-n\Delta t)) \cdot v_{TIRmj}((n+1)\Delta t) \quad (2)$$

$$(j = 1, 2, \ldots, 2N)$$

(where $i_j(t)$ is the current source representing the imaginary past of the characteristic impedance of a transmission line j, and $w_j$ is a current source resenting the coupling and transmission for line j, and Δt is a time step of the circuit simulation tool, and nΔt is the starting point, where n=0,1, 2,3).

* * * * *